(12) United States Patent
Takada et al.

(10) Patent No.: US 12,432,845 B2
(45) Date of Patent: Sep. 30, 2025

(54) VEHICLE-MOUNTED ELECTRONIC CONTROL DEVICE

(71) Applicant: HITACHI ASTEMO, LTD., Hitachinaka (JP)

(72) Inventors: Tomoyuki Takada, Hitachinaka (JP); Toshiaki Takai, Hitachinaka (JP); Shigenobu Komatsu, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 184 days.

(21) Appl. No.: 18/252,903

(22) PCT Filed: Aug. 31, 2021

(86) PCT No.: PCT/JP2021/031893
§ 371 (c)(1),
(2) Date: May 15, 2023

(87) PCT Pub. No.: WO2022/137652
PCT Pub. Date: Jun. 30, 2022

(65) Prior Publication Data
US 2023/0422391 A1    Dec. 28, 2023

(30) Foreign Application Priority Data
Dec. 25, 2020   (JP) .................................. 2020-217711

(51) Int. Cl.
*H05K 1/02*  (2006.01)
*B60R 16/03*  (2006.01)
*H05K 1/18*  (2006.01)

(52) U.S. Cl.
CPC ........... *H05K 1/0216* (2013.01); *B60R 16/03* (2013.01); *H05K 1/18* (2013.01);
(Continued)

(58) Field of Classification Search
None
See application file for complete search history.

(56) References Cited

U.S. PATENT DOCUMENTS 3,699,395 A * 10/1972 Boleky ............... H01L 23/5382
                                                  361/779
3,835,294 A *  9/1974 Krohn ...................... H05B 3/00
                                                  392/494
(Continued)

FOREIGN PATENT DOCUMENTS

JP     H06-283665 A    10/1994
JP     H11-346061 A    12/1999
(Continued)

OTHER PUBLICATIONS

Original and translation of CN 106329954 (Year: 2017).*
(Continued)

*Primary Examiner* — Timothy J. Dole
*Assistant Examiner* — Muhammed Azam
(74) *Attorney, Agent, or Firm* — Foley & Lardner LLP

(57) ABSTRACT

A circuit for EMC 1 in a power input circuit includes at least two wirings of a high-potential-side wiring 2 and a low-potential-side wiring 3 having different potentials and formed on a circuit board, a cutoff part 6 having one end connected to the high-potential-side wiring 2, a capacitor 10 connected between the other end of the cutoff part 6 and the low-potential-side wiring 3, a cutoff part 7 having one end connected to the high-potential-side wiring 2, a capacitor 20 connected between the other end of the cutoff part 7 and the low-potential-side wiring 3, and a capacitor 30 connected between a connection part 4 where the cutoff part 6 and the capacitor 10 are connected and a connection part 5 where the cutoff part 7 and the capacitor 20 are connected.

3 Claims, 3 Drawing Sheets

(52) U.S. Cl.
CPC .............. *H05K 2201/10015* (2013.01); *H05K 2201/10181* (2013.01); *H05K 2201/10537* (2013.01)

(56) References Cited

U.S. PATENT DOCUMENTS

| | | | | |
|---|---|---|---|---|
| 4,002,949 A * | 1/1977 | Westrom | ................ | H01H 85/38 337/204 |
| 4,272,753 A * | 6/1981 | Nicolay | ............... | H01H 69/022 337/297 |
| 4,394,639 A * | 7/1983 | McGalliard | ............ | H01R 13/68 337/292 |
| 4,491,860 A * | 1/1985 | Lim | .................... | H01L 23/5256 365/96 |
| 4,582,659 A * | 4/1986 | Hilgers | ............... | H03F 3/45475 427/101 |
| 4,626,818 A * | 12/1986 | Hilgers | ................ | H01H 85/046 257/E23.149 |
| 4,652,974 A * | 3/1987 | Ryan | .................... | H05K 1/0289 29/847 |
| 4,670,813 A * | 6/1987 | Reynolds | ............... | H01R 29/00 174/255 |
| 5,014,002 A * | 5/1991 | Wiscombe | ............... | G01R 1/02 324/537 |
| 5,311,053 A * | 5/1994 | Law | .................... | H01L 23/5252 257/E23.149 |
| 5,394,294 A | 2/1995 | Mei et al. | | |
| 5,572,409 A * | 11/1996 | Nathan | ................ | H01L 21/485 257/209 |
| 5,808,351 A * | 9/1998 | Nathan | ................ | H01R 29/00 257/665 |
| 5,898,312 A * | 4/1999 | Uhling | .................... | G01R 1/073 324/754.07 |
| 6,072,691 A * | 6/2000 | Suhara | .................... | H01G 11/18 307/109 |
| 7,504,925 B2 * | 3/2009 | Graf | ......................... | H01G 2/16 337/159 |
| 7,554,432 B2 * | 6/2009 | Graf | ........................ | H01C 7/126 337/296 |
| 7,821,207 B2 * | 10/2010 | Morimoto | ............ | H01J 61/327 315/32 |
| 8,022,641 B2 * | 9/2011 | Janik | ........................ | F21K 9/00 362/249.02 |
| 9,025,311 B1 * | 5/2015 | Bultitude | ................. | H01G 4/38 361/321.2 |
| 9,277,647 B2 * | 3/2016 | Fujimoto | .................. | H01G 4/30 |
| 9,288,908 B2 * | 3/2016 | Yamamoto | .............. | H01L 22/20 |
| 9,548,630 B2 * | 1/2017 | Sato | ....................... | H05K 7/209 |
| 9,646,747 B2 * | 5/2017 | Tamagawa | .......... | H01F 27/2804 |
| 9,729,188 B2 * | 8/2017 | Decker | ................... | H04B 5/72 |
| 9,773,588 B2 * | 9/2017 | Shimoichi | .............. | H01C 7/006 |
| 9,829,159 B2 * | 11/2017 | McGowan | ................. | F21K 9/20 |
| 9,847,202 B2 * | 12/2017 | Kim | .................... | H01H 85/0241 |
| 9,899,178 B2 * | 2/2018 | Furuta | ................ | H01H 85/0241 |
| 9,907,172 B2 * | 2/2018 | Berry | .................. | H05K 1/0293 |
| 10,093,251 B2 * | 10/2018 | Rutherford | ............. | B60R 16/03 |
| 10,178,770 B1 * | 1/2019 | Burk | ...................... | H01G 4/228 |
| 10,299,371 B2 * | 5/2019 | Yamano | ................... | H01G 4/12 |
| 10,681,814 B2 * | 6/2020 | Bultitude | .......... | H01L 23/49838 |
| 10,916,962 B2 * | 2/2021 | Hida | ......................... | H02J 7/14 |
| 11,056,444 B2 * | 7/2021 | Seidman | ........... | H01C 1/012 |
| 11,223,193 B2 * | 1/2022 | Tsuchiya | ................ | G01R 19/00 |
| 11,312,245 B2 * | 4/2022 | Mikami | .................. | B60R 16/03 |
| 2006/0120005 A1 * | 6/2006 | Van Sickle | .......... | H05K 1/0262 361/118 |
| 2007/0284578 A1 * | 12/2007 | Yoon | ..................... | G02F 1/1362 438/12 |
| 2018/0290608 A1 * | 10/2018 | Hida | ....................... | B60R 16/04 |
| 2019/0080982 A1 * | 3/2019 | Bultitude | ............... | H01L 25/50 |
| 2020/0067302 A1 * | 2/2020 | Tsuchiya | ................ | H02H 3/202 |
| 2023/0422391 A1 * | 12/2023 | Takada | ..................... | H05K 1/18 |

FOREIGN PATENT DOCUMENTS

| | | |
|---|---|---|
| JP | 2004-241506 A | 8/2004 |
| JP | 2016-143845 A | 8/2016 |

OTHER PUBLICATIONS

Original and translation of CN 103580992 (Year: 2014).*
International Search Report with English Translation and Written Opinion of International Patent Application No. PCT/JP2021/031893 dated Nov. 30, 2021 (8 pages).
English Translation of International Preliminary Report on Patentability and Written Opinion issued in PCT Application No. PCT/JP2021/031893 dated Jul. 6, 2023 (5 pages).

* cited by examiner

PRIOR ART

VEHICLE-MOUNTED ELECTRONIC CONTROL DEVICE

TECHNICAL FIELD

The present invention relates to a vehicle-mounted electronic control device.

BACKGROUND ART

Power input circuits of vehicle-mounted electronic control devices have conventionally been provided with a circuit for electromagnetic compatibility (EMC). For example, a circuit using a ceramic capacitor is known.

In a circuit for EMC using a ceramic capacitor, capacitors are typically connected in series between a high-potential-side wiring and a low-potential-side wiring to prevent overcurrent due to a short circuit failure of the capacitors. However, when the capacitors are connected in series, the number of necessary capacitors increases, and the combined capacitance decreases.

For example, PTL 1 discloses a vehicle-mounted electronic control device that operates by receiving power supplied from a direct-current power source, the electronic control device including a substrate part, a high-potential-side wiring part that is formed on the substrate part and serves as a high-potential-side path, a low-potential-side wiring part that is formed on the substrate part and serves as a low-potential-side path, two surface mount capacitors that are mounted on one surface side of the substrate part and are connected in series between the high-potential-side wiring part and the low-potential-side wiring part, and a conductor wiring part that is formed on the substrate part, is provided in parallel with a first capacitor forming one of the two surface mount capacitors, and is provided at least partially with a cutoff wiring that is fused when a second capacitor forming the other of the two surface mount capacitors is in a short-circuit state.

CITATION LIST

Patent Literature

PTL 1: JP 2016-143845 A

SUMMARY OF INVENTION

Technical Problem

In the conventional technique described above, the use of a pattern fuse achieves a configuration in which the combined capacitance does not decrease and the capacitance does not change even after a short circuit failure. However, since two capacitors are provided, one of which is connected to the high-potential-side wiring and the other one of which is connected to the low-potential-side wiring, the number of capacitors cannot be reduced.

The present invention has been made in view of the above, and an object thereof is to provide a vehicle-mounted electronic control device that includes a circuit for EMC and is capable of reducing the number of capacitors while preventing a decrease in the capacitance.

Solution to Problem

The present application includes a plurality of means for solving the above problem, and an example thereof is a vehicle-mounted electronic control device that operates by receiving power supply from a direct-current power source, the vehicle-mounted electronic control device including at least two wirings of a first wiring and a second wiring having different potentials and formed on a board, a first fuse part having one end connected to the first wiring, a first capacitor connected between the other end of the first fuse part and the second wiring, a second fuse part having one end connected to the first wiring, and a second capacitor connected between the other end of the second fuse part and the second wiring.

Advantageous Effects of Invention

The present invention can reduce the number of capacitors while preventing a decrease in the capacitance.

DESCRIPTION OF EMBODIMENTS

Hereinafter, embodiments of the present invention will be described with reference to the drawings.

First Embodiment

A first embodiment of the present invention will be described with reference to FIGS. 1 and 2.

Figure 1:
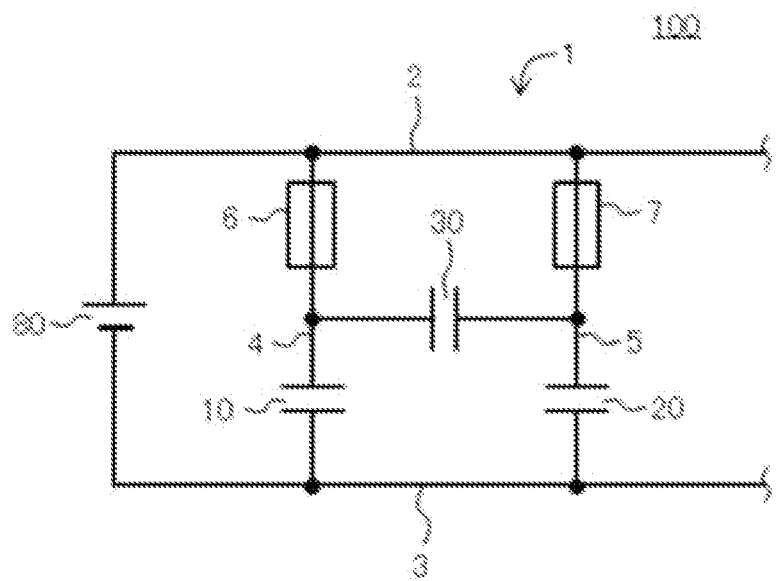
FIG. 1 is an electric circuit diagram schematically illustrating an extracted main part of a vehicle-mounted electronic control device according to a first embodiment.
Figure 2:
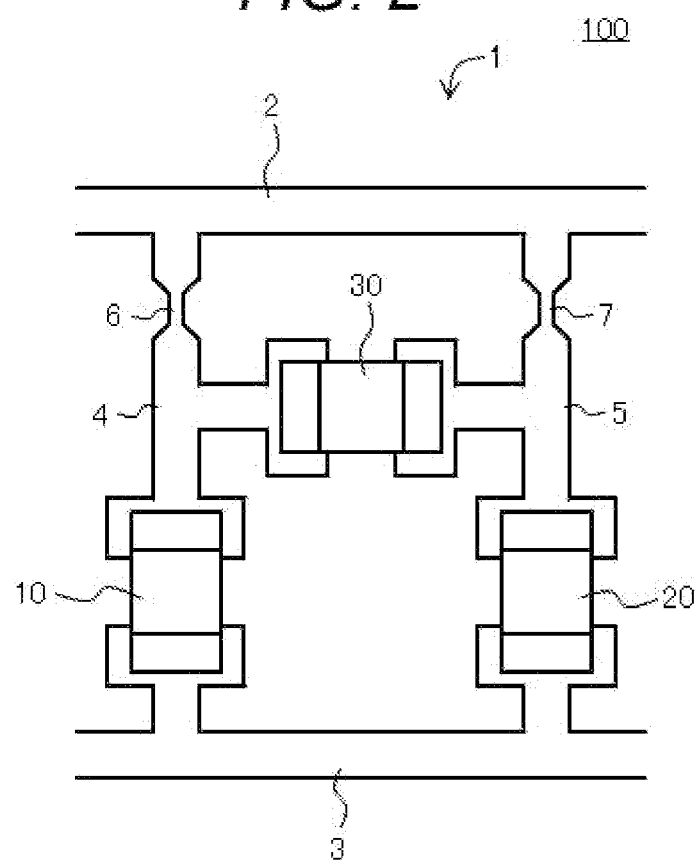
FIG. 2 is a component layout diagram schematically illustrating an extracted main part of the vehicle-mounted electronic control device according to the first embodiment.

FIGS. 1 and 2 are diagrams schematically illustrating an extracted main part of a vehicle-mounted electronic control device according to the present embodiment. FIG. 1 is an electric circuit diagram, and FIG. 2 is a component layout diagram. In FIGS. 1 and 2, a part of the configuration related to a circuit for EMC 1 to meet electromagnetic compatibility (EMC) is extracted from a power input circuit of a vehicle-mounted electronic control device 100, and illustration of electronic components such as coils, resistors, and electrolytic capacitors is omitted.

As illustrated in FIG. 1, the vehicle-mounted electronic control device 100 operates by receiving power supply from a direct-current power source 80 provided in a vehicle and functions as an electronic control device mounted on the vehicle. As illustrated in FIG. 2, the circuit for EMC 1 in the power input circuit of the vehicle-mounted electronic control device 100 includes wiring formed on a circuit board and various electronic components disposed on the circuit board.

The circuit for EMC 1 in the power input circuit includes at least two wirings of a high-potential-side wiring 2 (first wiring) and a low-potential-side wiring 3 (second wiring) having different potentials and formed on a circuit board, a cutoff part 6 (first fuse part) having one end connected to the high-potential-side wiring 2, a capacitor 10 (first capacitor) connected between the other end of the cutoff part 6 and the low-potential-side wiring 3, a cutoff part 7 (second fuse part) having one end connected to the high-potential-side wiring 2, a capacitor 20 (second capacitor) connected between the other end of the cutoff part 7 and the low-potential-side wiring 3, and a capacitor 30 (third capacitor) connected between a connection part 4 (first connection part) where the cutoff part 6 and the capacitor 10 are connected and a connection part 5 (second connection part) where the cutoff part 7 and the capacitor 20 are connected.

The high-potential-side wiring 2 is connected to the high-potential side of the direct-current power source 80, and the low-potential-side wiring 3 is connected to the low-potential side (for example, the ground level) of the direct-current power source 80.

The capacitors 10, 20, and 30 are surface mount capacitors (for example, ceramic capacitors), in which each electrode is connected to a land of a circuit pattern formed on the circuit board by solder or the like. The capacitances of the capacitors 10 and 20 are desirably the same. The capacitor 30 also desirably has the same capacitance as the capacitors 10 and 20 to prevent the noise removal capability as the circuit for EMC 1 from fluctuating before and after a short circuit failure to be described later.

The cutoff part 6 and the capacitor 10 are connected in series between the high-potential-side wiring 2 and the low-potential-side wiring 3 via the connection part 4 formed on the circuit board. The cutoff part 7 and the capacitor 20 are also connected in series between the high-potential-side wiring 2 and the low-potential-side wiring 3 via the connection part 5 formed on the circuit board. The pattern wiring of the circuit board is preferably wired as short as possible, and the pattern wiring length from the high-potential-side wiring 2 to the low-potential-side wiring 3 via the capacitor 10 and the various pattern wiring lengths from the high-potential-side wiring 2 to the low-potential-side wiring 3 via the capacitor 20 are desirably the same.

The capacitor 30 is connected between the connection part 4 and the connection part 5. That is, one end of the capacitor 30 is connected to the cutoff part 6 and the capacitor 10 via the connection part 4, and the other end of the capacitor 30 is connected to the cutoff part 7 and the capacitor 20 via the connection part 5.

The cutoff parts 6 and 7 are formed as circuit patterns on the circuit board and have a fuse function of cutting off the flow of current by fusing when a predetermined amount or more of current flows. In the cutoff parts 6 and 7, the wiring length can be shortened as the wiring width is narrowed in consideration of the amount of current that can flow and the amount of current that leads fusing, which tends to decrease the board area. For example, in the present embodiment, the wiring widths of the cutoff parts 6 and 7 are preferably 0.1 mm to 0.3 mm.

The operational effects of the present embodiment configured as described above will be described.

In a normal state in which no cutoff part is fused in the circuit for EMC 1, the capacitors 10 and 20 function as bypass capacitors between the high-potential-side wiring 2 and the low-potential-side wiring 3. At this time, the capacitor 30, not being charged or discharged, does not function as a bypass capacitor.

In an abnormal state in which a short circuit failure has occurred in the capacitor 10 because of warpage, thermal shrinkage, or the like of the circuit board, for example, the high-potential-side wiring 2 and the low-potential-side wiring 3 are in a short circuit state via the capacitor 10 (and the cutoff part 6). At this time, the current flowing through the capacitor 10 with short circuit failure rapidly increases, the cutoff part 6 is immediately fused because of heat generation caused by the increase in the current, and the increased current is cut off. Simultaneously with fusing of the cutoff part 6, the capacitor 30 functions as a bypass capacitor between the high-potential-side wiring 2 and the low-potential-side wiring 3.

That is, before the short circuit failure of the capacitor 10, the capacitors 10 and 20 connected in parallel between the high-potential-side wiring 2 and the low-potential-side wiring 3 function as bypass capacitors, and after the short circuit failure of the capacitor 10, the capacitors 20 and 30 connected in parallel between the high-potential-side wiring 2 and the low-potential-side wiring 3 function as bypass capacitors, and thus the fluctuation in capacitance of the bypass capacitor function before and after the short circuit failure of the capacitor 10 is decreased.

When a short circuit failure occurs in the capacitor the capacitor 30 functions as a bypass capacitor with fusing of the cutoff part 7 because of the same principle as that in a case where a short circuit failure occurs in the capacitor 10, and thus the fluctuation in capacitance of the bypass capacitor function before and after the short circuit failure of the capacitor 20 is decreased.

Figure 6:
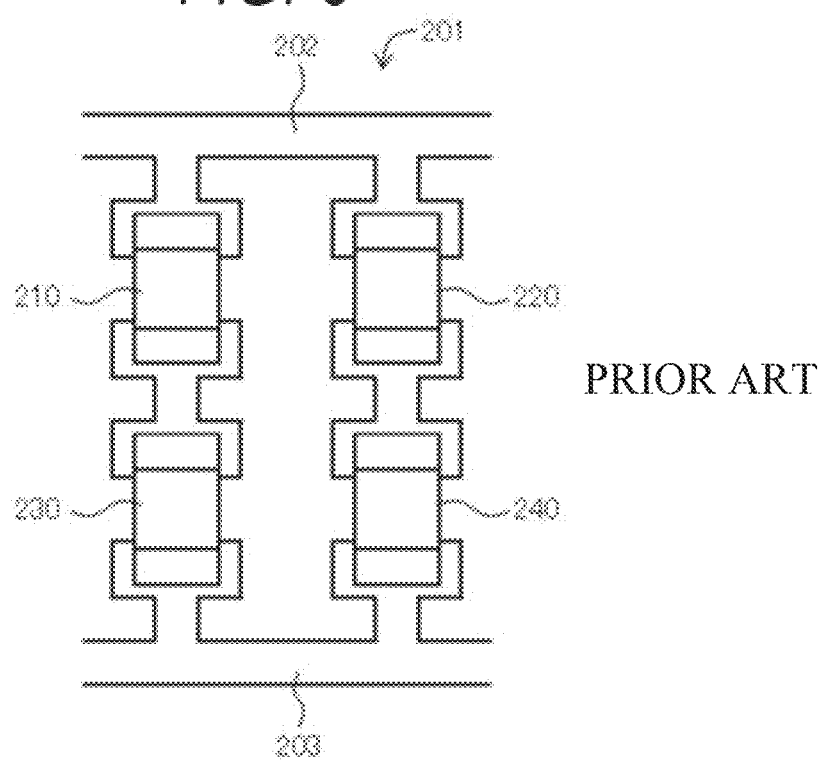
FIG. 6 is a component layout diagram illustrating a circuit for EMC of the related art as a comparative example.

FIG. 6 is a component layout diagram illustrating a circuit for EMC of the related art as a comparative example with respect to the present embodiment.

As illustrated in FIG. 6, in a circuit for EMC 201 in the related art, a capacitor 210 and a capacitor 230 are connected in series, and a capacitor 220 and a capacitor 240 are connected in series between a high-potential-side wiring 202 and a low-potential-side wiring 203 as a countermeasure against short circuit failures. At this time, since the combined capacitance of the capacitors connected in series is calculated with the product of the sum of the capacitances of the respective capacitors, the capacitance decreases when two capacitors are connected in series rather than when there is one capacitor. In the related art, since capacitors for series connection are required as a countermeasure against short circuit failures, there is a problem that the number of components (the number of capacitors) increases and the combined capacitance as a circuit for EMC decreases.

In the present embodiment, which includes the cutoff part 6 having one end connected to the high-potential-side wiring 2, the capacitor 10 connected between the other end of the cutoff part 6 and the low-potential-side wiring 3, the cutoff part 7 having one end connected to the high-potential-side wiring 2, the capacitor 20 connected between the other end of the cutoff part 7 and the low-potential-side wiring 3, and the capacitor 30 connected between the connection part 4 where the cutoff part 6 and the capacitor 10 are connected and the connection part 5 where the cutoff part 7 and the capacitor 20 are connected, can reduce the number of capacitors while preventing a decrease in the capacitance.

That is, in the present embodiment, adopting the configuration using the cutoff parts 6 and 7 can eliminate the need for series connection of capacitors as a countermeasure against short circuit failures, can prevent a decrease in the capacitance due to the series connection of capacitors, and can reduce the number of components of the capacitors.

Second Embodiment

A second embodiment of the present invention will be described with reference to FIGS. 3 and 4.

The present embodiment prevents short circuit failures from simultaneously occurring in the capacitors 10 and 20 in the first embodiment.

Figure 3:
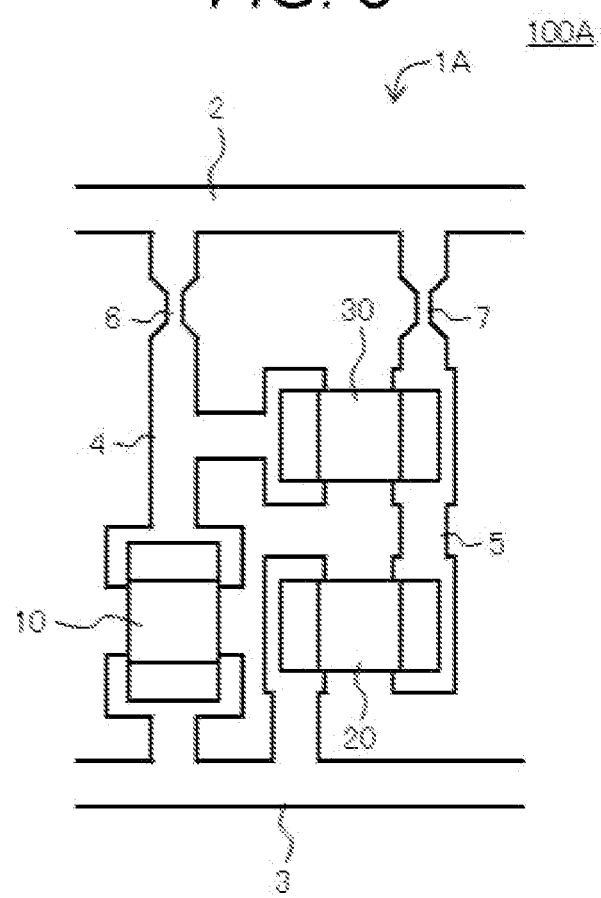
FIG. 3 is a component layout diagram schematically illustrating an extracted main part of a vehicle-mounted electronic control device according to a second embodiment.

FIG. 3 is a component layout diagram schematically illustrating an extracted main part of a vehicle-mounted electronic control device according to the present embodiment. In FIG. 3, the same members as those of the first embodiment are denoted by the same reference numerals, and the description thereof will be omitted.

In FIG. 3, a circuit for EMC 1A in the power input circuit of a vehicle-mounted electronic control device 100A includes at least two wirings of the high-potential-side wiring 2 (first wiring) and the low-potential-side wiring 3 (second wiring) having different potentials and formed on a circuit board, the cutoff part 6 (first fuse part) having one end connected to the high-potential-side wiring 2, the capacitor 10 (first capacitor) connected between the other end of the cutoff part 6 and the low-potential-side wiring 3, the cutoff part 7 (second fuse part) having one end connected to the high-potential-side wiring 2, the capacitor 20 (second capacitor) connected between the other end of the cutoff part 7 and the low-potential-side wiring 3, and the capacitor 30 (third capacitor) connected between the connection part 4 (first connection part) where the cutoff part 6 and the capacitor 10 are connected and the connection part 5 (second connection part) where the cutoff part 7 and the capacitor 20 are connected.

The capacitor 10 and the capacitor 20 have a rectangular shape, and the capacitor 10 and the capacitor 20 are disposed such that their longitudinal directions are different from each other. More specifically, the capacitor 10 and the capacitor 20 are mounted and disposed such that their longitudinal directions form, for example, a right angle (90°).

Other configurations are the same as those of the first embodiment.

Figure 4:
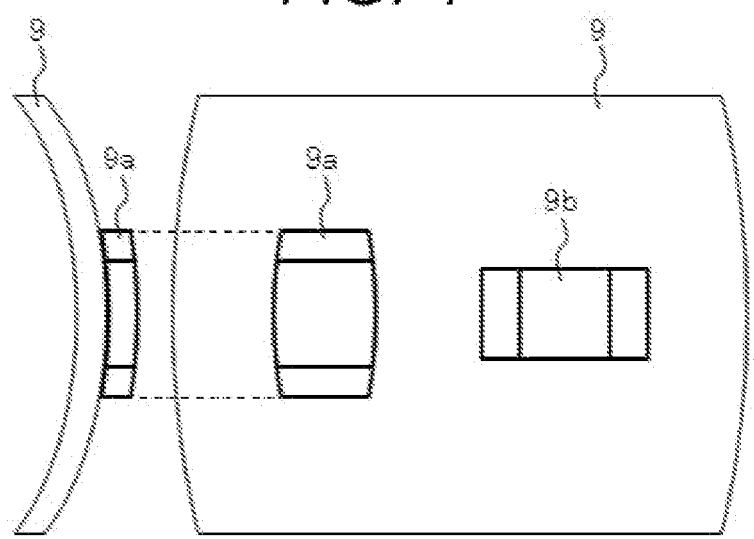
FIG. 4 is a diagram illustrating an example of a case where warpage has occurred in a circuit board.

FIG. 4 is a diagram illustrating an example of a case where warpage has occurred in the circuit board.

FIG. 4 illustrates a case where capacitors 9a and 9b are mounted on a circuit board 9. The capacitors 9a and 9b have a rectangular shape, and they are disposed such that their longitudinal directions form a right angle.

Warpage of the circuit board may occur during solder mounting of electronic components, mounting of the board to a housing, thermal expansion, board division, or the like. When warpage of the circuit board 9 has occurred in the direction illustrated in FIG. 4, that is, in a longitudinal direction of the capacitor 9a, stress is generated in the solder parts of the components mounted in a mounting direction represented by the mounting direction of the capacitor 9a. Thus, it is conceivable that a crack is generated in the capacitor 9a by the generated stress, causing a short circuit failure.

For the components mounted in a mounting direction represented by the mounting direction of the capacitor 9b, stress is hardly generated in the solder part with respect to the warping direction of the circuit board 9. Thus, cracks are less likely to occur in the capacitor 9b, and a short circuit failure is less likely to occur.

That is, depending on the relationship between the warpage of the circuit board 9 and the mounting direction of the capacitors 9a and 9b, it is also conceivable that short circuit failures may occur simultaneously in a plurality of capacitors.

For example, in the first embodiment, when short circuit failures have occurred simultaneously in the capacitors 10 and 20, the noise resistance as the circuit for EMC 1 degrades since the cutoff parts 6 and 7 are fused and the capacitor 30 does not function as a bypass capacitor.

In the present embodiment, since the capacitors 10 and 20 are disposed such that their longitudinal directions are different from each other, it is possible to prevent short circuit failures from simultaneously occurring in the capacitors 10 and 20 with respect to warpage of the circuit board in one direction.

As an effective mounting direction for preventing simultaneous occurrence of short circuit failures, it is preferable to provide a mounting direction in which a longitudinal direction of the board and a longitudinal direction of a capacitor are aligned and a mounting direction in which the longitudinal direction of the board and a longitudinal direction of a capacitor form 90° (right angle) when the board has a shape having different vertical and horizontal lengths, such as a rectangle. That is, it is desirable to provide a capacitor mounted with its longitudinal direction being aligned with a direction in which warpage is likely to occur from the board shape and a capacitor mounted with its longitudinal direction forming 90° (right angle) with the direction in which warpage is likely to occur.

Third Embodiment

A third embodiment of the present invention will be described with reference to FIG. 5.

The present embodiment is to reduce or eliminate an influence when a short circuit failure has occurred in the capacitor 30 in the first and second embodiments.

Figure 5:
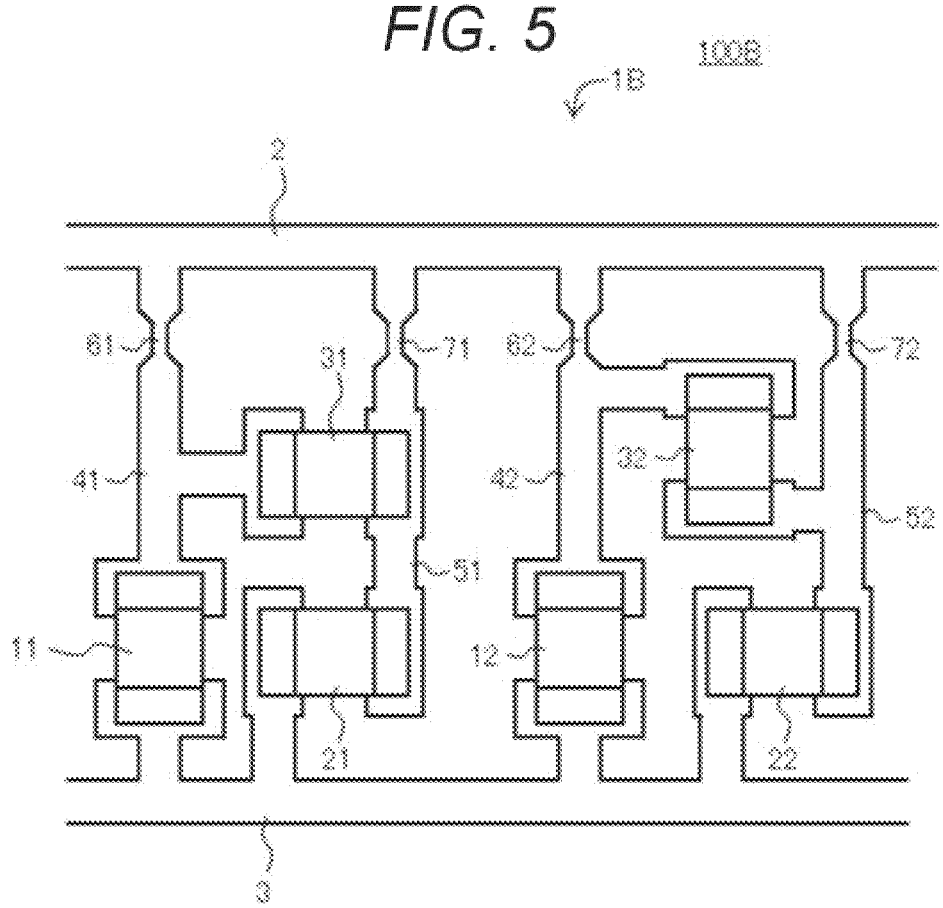
FIG. 5 is a component layout diagram schematically illustrating an extracted main part of a vehicle-mounted electronic control device according to a third embodiment.

FIG. 5 is a component layout diagram schematically illustrating an extracted main part of a vehicle-mounted electronic control device according to the present embodiment. In FIG. 5, the same members as those in the first and second embodiments are denoted by the same reference numerals, and description thereof will be omitted.

As illustrated in FIG. 5, in the circuit for EMC, a plurality of (in the present embodiment, for example, two) circuits having the configuration illustrated in the first embodiment or the second embodiment are connected in parallel between the high-potential-side wiring 2 and the low-potential-side wiring 3 to enhance the noise resistance.

In FIG. 5, a circuit for EMC 1B in the power input circuit of a vehicle-mounted electronic control device 100B according to the present embodiment includes at least two wirings of the high-potential-side wiring 2 (first wiring) and the low-potential-side wiring 3 (second wiring) having different potentials and formed on a circuit board, a cutoff part 61 (first fuse part) having one end connected to the high-potential-side wiring 2, a capacitor 11 (first capacitor) connected between the other end of the cutoff part 61 and the low-potential-side wiring 3, a cutoff part 71 (second fuse part) having one end connected to the high-potential-side wiring 2, a capacitor 21 (second capacitor) connected between the other end of the cutoff part 71 and the low-potential-side wiring 3, a capacitor 31 (third capacitor) connected between a connection part 41 (first connection part) where the cutoff part 61 and the capacitor 11 are connected and a connection part 51 (second connection part) where the cutoff part 71 and the capacitor 21 are connected, a cutoff part 62 (third fuse part) having one end connected to the high-potential-side wiring 2, a capacitor 12 (fourth capacitor) connected between the other end of the cutoff part 62 and the low-potential-side wiring 3, a cutoff part 72 (fourth fuse part) having one end connected to the high-potential-side wiring 2, a capacitor 22 (fifth capacitor) connected between the other end of the cutoff part 72 and the low-potential-side wiring 3, and a capacitor 32 (sixth capacitor) connected between a connection part 42 (third connection part) where the cutoff part 62 and the capacitor 12 are connected and a connection part 52 (fourth connection part) where the cutoff part 72 and the capacitor 22 are connected.

The capacitor 11 and the capacitor 21 have a rectangular shape, and the capacitor 11 and the capacitor 21 are disposed such that their longitudinal directions are different from each other. More specifically, the capacitor 11 and the capacitor 21 are mounted and disposed such that their longitudinal directions form, for example, a right angle (90°).

The capacitor 12 and the capacitor 22 have a rectangular shape, and the capacitor 12 and the capacitor 22 are disposed such that their longitudinal directions are different from each other. More specifically, the capacitor 12 and the capacitor 22 are mounted and disposed such that their longitudinal directions form, for example, a right angle (90°).

The capacitor 31 and the capacitor 32 have a rectangular shape, and the capacitor 31 and the capacitor 32 are disposed such that their longitudinal directions are different from each other. More specifically, the capacitor 31 and the capacitor 32 are mounted and disposed such that their longitudinal directions form, for example, a right angle (90°).

Other configurations are the same as those of the first embodiment.

In the circuit for EMC, it is conceivable that stress is generated in the solder connection parts of the capacitors depending on the warping direction of the circuit board, and a short circuit failure occurs. That is, depending on the relationship between the warpage of the circuit board and the mounting direction of the capacitors, it is also conceivable that short circuit failures may occur simultaneously in a plurality of capacitors.

For example, in the second embodiment, short circuit failures are prevented from simultaneously occurring in the capacitor 10 and the capacitor 20 by disposing the capacitors 10 and 20 such that their longitudinal directions are different from each other. However, there is a possibility that short circuit failures simultaneously occur in the capacitors 20 and 30. In this case, since only the capacitor 10 operates, the noise resistance degrades. When a plurality of circuits having the configuration described in the first embodiment or the second embodiment are connected in parallel between the high-potential-side wiring 2 and the low-potential-side wiring 3 to enhance the noise resistance, there is a possibility that short circuit failures occur simultaneously in many capacitors depending on the warping direction of the board, and in this case, the noise resistance extremely degrades.

In the present embodiment, the capacitor 11 and the capacitor 21 are disposed such that their longitudinal directions are different from each other, the capacitor 12 and the capacitor 22 are disposed such that their longitudinal directions are different from each other, and the capacitor 31 and the capacitor 32 are disposed such that their longitudinal directions are different from each other. Thus, it is possible to prevent simultaneous occurrence of short circuit failures in the capacitors 11 and 21, simultaneous occurrence of short circuit failures in the capacitors 12 and 22, and simultaneous occurrence of short circuit failures in the capacitors 31 and 32 with respect to warpage of the circuit board in one direction. That is, in the present embodiment, it is possible to prevent simultaneous occurrence of short circuit failures in many capacitors due to the warping direction of the board, and it is possible to prevent the noise resistance from extremely degrading.

In addition, since the plurality of capacitors functioning at a normal time are disposed such that their longitudinal directions are different from each other, and the plurality of capacitors functioning at an abnormal time is disposed such that their longitudinal directions are different from each other, it is possible to prevent the noise resistance from degrading because of a short circuit failure of the capacitors.

SUPPLEMENTARY NOTE

The present invention is not limited to the above embodiments, and it includes various modifications and combinations without departing from the gist of the present invention.

For example, in the first to third embodiments, the case is exemplified where a cutoff part (cutoff parts 6, 7, 61, 62, 71, and 72) is connected to the high-potential-side wiring 2, and a capacitor (capacitors 10, 11, 12, 20, 21, and 22) is connected to the low-potential-side wiring 3. However, the capacitor may be connected to the high-potential-side wiring 2, and the cutoff part may be connected to the low-potential-side wiring 3.

The present invention is not limited to one including all the configurations described in the above embodiments, and it includes one in which some of the configurations are deleted. Some or all of the above-described configurations, functions, and the like may be realized by, for example, designing with an integrated circuit. Each of the above-described configurations, functions, and the like may be realized with software by a processor interpreting and executing a program for realizing each function.

REFERENCE SIGNS LIST 1, 1A, 1B circuit for EMC
2 high-potential-side wiring
3 low-potential-side wiring
4, 5 connection part
6, 7 cutoff part
9 circuit board
9a, 9b capacitor
11, 12, 20, 21, 22, 30, 31, 32 capacitor
41, 42, 51, 52 connection part
61, 62, 71, 72 cutoff part
80 direct-current power source
100, 100A, 100B vehicle-mounted electronic control device
201 circuit for EMC
202 high-potential-side wiring
203 low-potential-side wiring
210, 220, 230, 240 capacitor

The invention claimed is:
1. A vehicle-mounted electronic control device that operates by receiving power supply from a direct-current power source, the vehicle-mounted electronic control device comprising:
at least two wirings of a first wiring and a second wiring having different potentials and formed on a board;
a first fuse part having one end connected to the first wiring;
a first capacitor connected between another end of the first fuse part and the second wiring;
a second fuse part having one end connected to the first wiring;
a second capacitor connected between the other end of the second fuse part and the second wiring; and
a third capacitor connected between a first connection part where the first fuse part and the first capacitor are connected and a second connection part where the second fuse part and the second capacitor are connected.

2. The vehicle-mounted electronic control device according to claim 1, wherein
the first capacitor and the second capacitor have a rectangular shape, and
the first capacitor and the second capacitor are disposed such that longitudinal directions of the first capacitor and the second capacitor are different from each other.

3. The vehicle-mounted electronic control device according to claim 1, comprising:
a third fuse part having one end connected to the first wiring;
a fourth capacitor connected between another end of the third fuse part and the second wiring;
a fourth fuse part having one end connected to the first wiring;
a fifth capacitor connected between the other end of the fourth fuse part and the second wiring; and
a sixth capacitor connected between a third connection part where the third fuse part and the fourth capacitor are connected and a fourth connection part where the fourth fuse part and the fifth capacitor are connected, wherein
the third capacitor and the sixth capacitor have a rectangular shape, and
the third capacitor and the sixth capacitor are disposed such that longitudinal directions of the third capacitor and the sixth capacitor are different from each other.

* * * * *